United States Patent
Lo

(10) Patent No.: US 6,299,831 B1
(45) Date of Patent: Oct. 9, 2001

(54) HIGH PERFORMANCE CU/CR SPUTTER TARGETS FOR SEMICONDUCTOR APPLICATION

(75) Inventor: Chi-Fung Lo, Fort Lee, NJ (US)

(73) Assignee: Praxair S.T. Technology, Inc., North Haven, CT (US)

( * ) Notice: Subject to any disclaimer, the term of this patent is extended or adjusted under 35 U.S.C. 154(b) by 0 days.

(21) Appl. No.: 09/353,503

(22) Filed: Jul. 14, 1999

(51) Int. Cl.[7] .................................. B22F 3/12; B22F 3/14
(52) U.S. Cl. .................................. 419/32; 419/26; 419/45; 419/48; 419/49; 419/57; 419/60
(58) Field of Search .................................. 419/49, 26, 32, 419/45, 48, 57, 60

(56) References Cited

U.S. PATENT DOCUMENTS 5,718,778 * 2/1998 Murata et al. ........................ 148/668
5,778,302 * 7/1998 Ivanov .................................... 419/32

FOREIGN PATENT DOCUMENTS 01309961  12/1989  (JP).
WO9712074  4/1997  (WO).

OTHER PUBLICATIONS

ASM Handbook, vol. 7, Powder Metallurgy, pp. 308–309, 501, 1984.*

* cited by examiner

Primary Examiner—Daniel J. Jenkins
(74) Attorney, Agent, or Firm—Blake T. Biederman

(57) ABSTRACT

A method is provided for fabricating Cu/Cr sputter targets having a density of at least about 90% of theoretical density and an oxygen content of less than about 1000 ppm. According to the principles of the present invention, Cu and Cr powders, each having particles in the size range of about 20 $\mu$m to about 150 $\mu$m and having oxygen contents preferably less than about 1200 ppm and 600 ppm, respectively, are blended and pressed by hot pressing. A low-oxygen content, high-density Cu/Cr target is thereby achieved for the sputtering of thin films having a defect generation of about 0%.

13 Claims, 1 Drawing Sheet

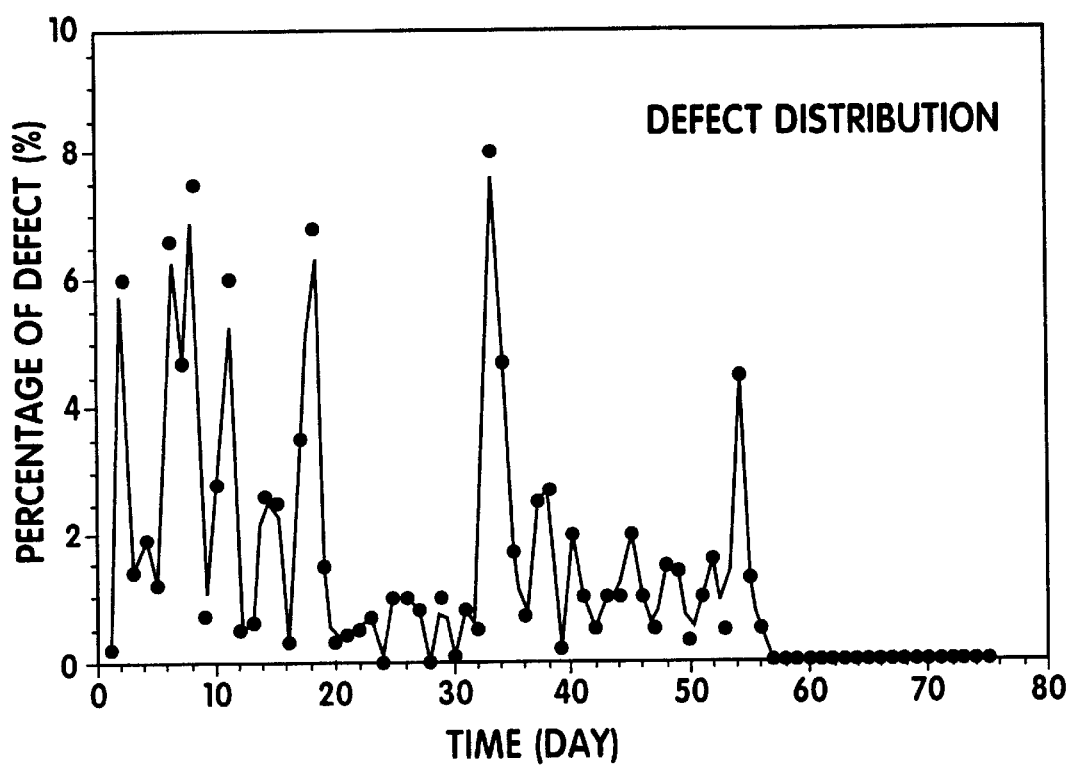

HIGH PERFORMANCE CU/CR SPUTTER TARGETS FOR SEMICONDUCTOR APPLICATION

FIELD OF THE INVENTION

This invention relates to the fabrication of low-oxygen copper/chromium sputter targets for use in physical vapor deposition of thin films.

BACKGROUND OF THE INVENTION

In the manufacture of sputter targets used in the semiconductor industry, and more particularly sputter targets used in physical vapor deposition (PVD) of thin films onto complex integrated circuits, it is desirable to produce a sputter target that will provide film uniformity, minimal particle generation during sputtering, desired electrical properties and minimal chip defect. Furthermore, to meet the reliability requirements for diffusion barriers or plugs of complex integrated circuits, the sputter target must have high-purity and high-density.

Cu/Cr thin films are commonly used as the adhesion/barrier layer in flip-chip bonding to form the interconnection between the semiconductor chip and the substrate, such as an aluminum bonding pad or ceramic base. The Cu/Cr film is deposited between a Cu layer and a Cr layer. The Cu layer adheres the solder, typically 90Pb/10Sn, to the chip, whereas the Cr bonds to the Al pad or ceramic base.

Current methods to achieve suitable Cu/Cr sputter targets for use in complex integrated circuits involve blending fine particle size Cu and Cr powders followed by sintering the powder by hot-pressing or hot-isostatic-pressing. Using either of these techniques to press powders with powder sizes less than 20 μm, the density of the pressed target material is about 90% of theoretical density. The fine grain size of the powder materials is believed to contribute to higher uniformity of the deposited film. However, the sputter targets fabricated by these methods have a high oxygen content, on the order of about 3000 ppm average. The inventors of the present invention have discovered that the fine powder size distribution used in Cu/Cr targets is a large contributing factor to the high oxygen content in the pressed sputter target blanks, and that oxygen in the Cu/Cr layer contributed via target sputtering is detrimental to the integrity of the film, and results in an increase in the percentage of chip defect. The sputter targets currently produced, which have an average oxygen content of about 3000 ppm, generate defects in about 3% of the semiconductor chips, on average. Thus, the Cu/Cr sputter targets fabricated by hot-pressing or hot-isostatic-pressing fine particle size powders have proved unreliable for use in complex integrated circuits.

There is thus a need to develop a method for fabricating low-oxygen, high-density Cu/Cr sputter targets that will meet the reliability requirements for complex integrated circuits, and specifically, that will decrease or eliminate chip defects due to high oxygen content.

SUMMARY OF THE INVENTION

The present invention provides a Cu/Cr sputter target having a density of at least about 90% of theoretical density and an oxygen content less than about 1000 ppm, and preferably less than 900 ppm. This high-density, low-oxygen Cu/Cr sputter target is fabricated by (a) blending a Cu powder having a controlled powder size in the range of about 20 μm to about 150 μm and an oxygen content preferably less than about 1200 ppm with a Cr powder having a controlled powder size in the range of about 20 μm to about 150 μm and an oxygen content preferably less than about 600 ppm, and a total oxygen content in the blended powder preferably less than 900 ppm and more preferably less than 800 ppm; and (b) pressing the powder for at least about 1 hour to a density of at least 90% of theoretical density. The pressed Cu/Cr target has an oxygen content less than about 1000 ppm, preferably less than 900 ppm, and the thin films deposited therefrom have about 0% defect generation.

In a first embodiment of the present invention, the blended powder is hot-isostatic-pressed at a temperature of about 950° C. to about 1050° C. and a pressure of about 10 ksi to about 40 ksi for about 1 hour to about 5 hours. In a second embodiment of the present invention, the blended powder is hot-uniaxial-pressed at a temperature of about 950° C. to about 1050° C. and a pressure of about 1 ksi to about 4 ksi for about 1 hour to about 8 hours. Prior to hot-uniaxial-pressing, the powder may be heated to about 250° C.–300° C. for about 1–4 hours in a hydrogen-purged vacuum hot-pressing chamber.

These and other objects and advantages of the present invention shall become more apparent from the accompanying drawings and description thereof.

BRIEF DESCRIPTION OF THE DRAWINGS

The accompanying drawing, which is incorporated in and constitutes a part of this specification, illustrates embodiments of the invention and, together with a general description of the invention given above, and the detailed description given below, serves to explain the principles of the invention.

The FIGURE is a plot of the percentage of defects obtained each day from a sample of thin films produced by prior art targets compared to films produced by targets of the present invention.

DETAILED DESCRIPTION

According to the principles of the present invention, a Cu/Cr sputter target is fabricated having an oxygen content less than about 1000 ppm and a density of at least 90% of theoretical density. By controlling the particle sizes of the copper and chromium powders, the oxygen content of Cu/Cr sputter targets may be decreased to less than about 1000 ppm, and preferably less than 900 ppm. Using these low-oxygen sputter targets to form Cu/Cr thin films for connections between semiconductor chips and aluminum or ceramic bases in semiconductor device fabrication, the defect generation is decreased to about 0%.

To achieve the low-oxygen, high-density Cu/Cr sputter target, a Cu powder is provided having particles in the size range of about 20 μm to about 150 μm and an oxygen content preferably less than about 1200 ppm, and a Cr powder is provided having particles in the size range of about 20 μm to about 150 μm and an oxygen content preferably less than about 600 ppm. The total oxygen content of the blended powder is preferably less than about 900 ppm, and more preferably less than about 800 ppm. The larger powder size distribution is largely responsible for the low oxygen content of the particles, and so control of the powder size will likewise control oxygen content. The powder size distribution of the present invention will allow for a uniform blending between the copper and chromium powders and will enable a density of higher than 90% to be achieved in a pressed sputter target blank.

To blend the copper and chromium powders, the powders are weighed in a glove box, preferably filled with argon gas or other suitable inert gas. Preferably equal amounts of the copper and chromium powders are weighed such that the final sputter target is a 50Cu/50Cr sputter target, although this may vary depending on the requirements for the thin film. For a 50/50 target, a 1200 ppm oxygen-containing Cu powder will contribute 600 ppm oxygen to the total oxygen content of the blended powder, and a 400 ppm oxygen-containing Cr powder will contribute 200 ppm oxygen, for a total oxygen content of 800 ppm in the blended powder. Alternatively, a 1000 ppm oxygen-containing Cu powder will contribute 500 ppm oxygen to the total oxygen content of the blended powder, and a 600 ppm oxygen-containing Cr powder will contribute 300 ppm oxygen, also for a total oxygen content of 800 ppm in the blended powder. Controlling to less than about 800–900 ppm oxygen in the blended powder allows for up to about 100–200 ppm oxygen to be contributed during processing of the powder into the final pressed sputter target before reaching 1000 ppm. Excess of 1000 ppm oxygen in the final pressed sputter target will likely increase defect generation in the thin film to some value above 0%.

The powders are loaded into a blending can, preferably within the argon filled glove box, and sealed in the can with blending media, such as pure copper or pure chromium slugs. The sealed can is then vibrated to blend the powders, preferably for at least about 3 hours. The blending media breaks up any agglomerates that have formed in the powders. The blended Cu/Cr powder is removed from the blending can and separated from the blending media, such as by using a sieve, preferably still within the argon filled glove box.

The blended powder is then pressed for at least one hour at a temperature between about 950° C. to about 1050° C. to a density of at least 90% of theoretical density. The larger powder size distribution does not affect the sintering behavior of the powder, and thus, there is no significant change in the density of the pressed blank as compared to targets made with fine particle size distributions of less than 20 $\mu$m. The pressed sputter target has an oxygen content less than about 1000 ppm, more preferably less than about 900 ppm, and typically within the range of 600 ppm to 900 ppm. The pressing technique is preferably either hot-uniaxial-pressing or hot-isostatic-pressing (HIPing).

When using the hot-uniaxial-pressing technique to press the blended powder, the powder is pressed using an inert gas or vacuum hot-pressing machine at a temperature of about 950° C. to about 1050° C. and a pressure of about 1 ksi to about 4 ksi for about 1–8 hours. The hot-uniaxial-pressing machine typically uses graphite die molds, although other materials may be used. The inert gas is preferably argon or nitrogen.

When using the hot-isostatic-pressing technique to press the blended powder, the powder is pressed at a temperature of about 950° C. to about 1050° C. and a pressure of about 10 ksi to about 40 ksi for about 1–5 hours. The HIPing method requires the use of an evacuated and sealed capsule for containing the powder material during pressing. The capsule material must be capable of substantial deformation because the HIPing method uses high pressure to achieve about a 50–70% volume reduction. Furthermore, the capsule material must have a melting point higher than the HIPing temperature. Thus, any material of sufficiently high melting point that can withstand the degree of deformation caused by the HIPing process is suitable for the present invention. Suitable materials may include, for example, beryllium, cobalt, copper, iron, molybdenum, nickel, titanium or steel.

The pressed target blank can then be machined to final dimensions using known techniques, such as electro-discharge machining, water-jet cutting or a regular mechanical lathe.

The sputter targets fabricated by this process have a density higher than 90% of theoretical density, achieved despite the use of the larger particle size starting powder. The combination of the blending and pressing processes together with a controlled particle size starting powder between 20 $\mu$m and 150 $\mu$m produces a highly dense, low-oxygen content Cu/Cr sputter target. This high-density and low oxygen content reduces defect generation in the thin films sputtered from the Cu/Cr targets of the present invention.

In an alternative embodiment of the present invention, the copper and chromium powders of controlled size and oxygen content are blended as discussed above, and then loaded into a graphite die mold in a vacuum hot-uniaxial-pressing chamber. The chamber is then purged with hydrogen, at 50 sccm to 150 sccm. The blended powder is then heated to about 250° C. to about 300° C. and held at that temperature for about 1 to about 4 hours without external applied pressure. The hot-uniaxial-pressing chamber is then evacuated to less than about $10^{-5}$ mTorr and the powder is heated to a temperature of about 950° C. to about 1050° C. while simultaneously applying a pressure of about 1 ksi to about 3 ksi. The powder is held at the temperature and pressure for about 1 to about 8 hours to ensure that the pressed blank density is at least 90% of theoretical density.

EXAMPLE

Two series of tests for comparative purposes were run, the first using high oxygen Cu/Cr sputter targets of the prior art, and the second using low oxygen Cu/Cr sputter targets of the present invention. In the first test series, each day for 56 days, high oxygen targets of the prior art having an oxygen content between about 2000 and 4000 ppm were used to deposit Cu/Cr thin films. Numerous thin films were tested each day to determine the percentage of defects in the thin films. The daily percentages were recorded on the plot shown in the Figure. As the Figure shows, the percentage of defects for the prior art high oxygen targets ranges anywhere from 0% to as high as 8% on any given day, and most often between 0.5% to 3%. Thus, the Figure demonstrates the lack of consistency of thin films produced by these prior art targets, most likely attributed to varying content of oxygen in the targets. In the second test series, each day from the fifty-seventh day to the seventy-fifth day, low oxygen Cu/Cr sputter targets of the present invention having an oxygen content less than 900 ppm were used to deposit Cu/Cr thin films, and numerous of these thin films were again tested each day to determine the percentage of defects in the thin films. As the Figure shows, the low oxygen targets of the present invention consistently produced thin films with 0% defect generation.

Thus, the present invention provides Cu/Cr sputter targets having a density of at least 90% of theoretical density and an oxygen content of less than about 900 ppm by controlling the particle size of the starting copper and chromium powders to between 20 $\mu$m and 150 $\mu$m and hot pressing the blended powders. The thin films produced from the sputter targets of the present invention generate 0% defects and thus meet the high reliability requirements for thin films on complex integrated circuits.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. For example, sputter targets of varying Cu:Cr ratios may be produced according to the general principles of the present invention. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A method of fabricating low-oxygen, high-density Cu/Cr sputter targets, comprising the steps of:

blending a Cu powder and a Cr powder to form a blended Cu/Cr powder, the Cu powder and the Cr powder each having particles in the size range of about 20 $\mu$m to about 150 $\mu$m, and the blended Cu/Cr powder having an oxygen content less than about 800 ppm; and pressing the blended Cu/Cr powder for at least 1 hour to form a target blank, the blank having a 100 to 200 ppm increase in the oxygen content, a density of at least 90% of theoretical density and an oxygen content less than about 1000 ppm.

2. The method of claim 1, wherein the Cu powder has an oxygen content less than about 1200 ppm and the Cr powder has an oxygen content less than about 600 ppm.

3. The method of claim 1, further comprising loading the Cu and Cr powders in a blending can in an inert atmosphere.

4. The method of claim 1, wherein the Cu and Cr powders are blended in equal amounts.

5. The method of claim 1, wherein the Cu and Cr powders are blended for at least about 3 hours.

6. The method of claim 1, wherein the Cu and Cr powders are blended with blending media, and wherein the blending media is Cu or Cr slugs.

7. The method of claim 1, wherein the pressing step comprises hot-isostatic-pressing the blended Cu/Cr powder at a temperature of about 950° C. to about 1050° C. and a pressure of about 10 ksi to about 40 ksi for about 1–5 hours.

8. The method of claim 7, wherein the blended Cu/Cr powder is hot-isostatic-pressed in an evacuated and sealed capsule made of a material selected from the group consisting of: titanium, iron, beryllium, cobalt, copper, iron, molybdenum, nickel, titanium, steel and alloys thereof.

9. The method of claim 1, wherein the pressing step comprises hot-uniaxial-pressing the blended Cu/Cr powder at a temperature of about 950° C. to about 1050° C. and a pressure of about 1 ksi to about 4 ksi for about 1–8 hours.

10. The method of claim 9, wherein the blended Cu/Cr powder is vacuum hot-uniaxial-pressed.

11. The method of claim 10, wherein the blended Cu/Cr powder is heated, prior to the pressing step, in a vacuum hot-uniaxial-pressing chamber purged with hydrogen to a temperature of about 250° C. to about 300° C. and held for about 1 hour to about 4 hours.

12. The method of claim 9, wherein the hot-uniaxial-pressing step occurs in an inert gas atmosphere.

13. The method of claim 1, further comprising the step of machining the target blank by a method selected from the group consisting of: electro-discharge-machining, water-jet cutting, and mechanical lathe.

* * * * *